United States Patent
Lin et al.

(10) Patent No.: US 7,269,055 B2
(45) Date of Patent: Sep. 11, 2007

(54) SRAM DEVICE WITH REDUCED LEAKAGE CURRENT

(75) Inventors: Wesley Lin, Jhubei (TW); Fang-Shi Jorcan Lai, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 11/353,410

(22) Filed: Feb. 13, 2006

(65) Prior Publication Data

US 2007/0189102 A1   Aug. 16, 2007

(51) Int. Cl.
*G11C 11/24* (2006.01)
(52) U.S. Cl. .................. 365/154; 365/156; 365/189.09
(58) Field of Classification Search ................ 365/154, 365/156, 226, 227, 189.09, 189.11
See application file for complete search history.

(56) References Cited

U.S. PATENT DOCUMENTS

| | | | |
|---|---|---|---|
| 6,560,139 B2 | 5/2003 | Ma et al. | 365/154 |
| 6,654,277 B1 * | 11/2003 | Hsu et al. | 365/154 |
| 6,724,648 B2 * | 4/2004 | Khellah et al. | 365/154 |
| 6,839,299 B1 * | 1/2005 | Bhavnagarwala et al. | 365/226 |
| 7,055,007 B2 * | 5/2006 | Flautner et al. | 711/156 |
| 7,061,820 B2 * | 6/2006 | Deng | 365/227 |

* cited by examiner

*Primary Examiner*—Gene N. Auduong
(74) *Attorney, Agent, or Firm*—Kirkpatrick & Lockhart Preston Gates Ellis LLP

(57) ABSTRACT

The present invention discloses a memory device with a leakage current reduction feature. The memory device includes at least one memory cell for storing a value, and at least one switch module coupled to the memory cell for generating an operating voltage at various levels depending on various operation modes of the memory cell. The operating voltage is at a first level when the memory cell is being accessed, and is at a second level lower than the first level when the memory cell is not being accessed, thereby reducing a leakage current for the memory cell.

19 Claims, 3 Drawing Sheets

US 7,269,055 B2

SRAM DEVICE WITH REDUCED LEAKAGE CURRENT

BACKGROUND

The present invention relates generally to integrated circuit designs, and more particularly to a static random access memory (SRAM) with reduced leakage current.

SRAM, a volatile memory device, provides data storage capability as long as it is supplied with power. As opposed to dynamic random access memory (DRAM), SRAM provides faster and more reliable data storage, and does not need to be refreshed constantly. A standard six-transistor SRAM cell includes a pair of cross-connected inverters and two pass-gate transistors. The inverters are coupled between a power supply node and ground. The pass-gate transistors couple the inverters to a bit line and a complementary bit line, respectively. When the cell is being accessed, the pass-gate transistors are selected to allow the cross-connected inverters to be written into or read from.

Many efforts have been made to reduce the leakage current of SRAM in order to improve its reliability. FIG. 1 schematically illustrates a conventional SRAM cell 100 with the leakage current reduction feature (see, U.S. Pat. No. 6,560,139). The SRAM cell 100 includes PMOS transistors 102 and 104 serially coupled with NMOS transistors 106 and 108, respectively, between power supply nodes having an operating voltage CVDD and an NMOS transistor 110. When the cell 100 is being accessed, the NMOS transistor 110 is turned on to allow the transistors 102, 104, 106 and 108 to function properly. When the cell 100 is not being accessed, the NMOS transistor 110 is turned off for reducing the leakage current from the bit line or the power supply nodes (CVDD) to ground.

One drawback of the conventional SRAM cell 100 is that the NMOS transistor 110 may adversely affect the operation of the NMOS transistors 106 and 108. Conventionally, the NMOS transistors 106, 108 and 110 are constructed directly on the same P-type substrate. When a voltage is applied to the gate of the NMOS transistor 110, the bias between the substrate and the sources of the NMOS transistors 106 and 108 can be adversely affected. Thus, the NMOS transistor 110 may cause a reliability issue to the cell 100.

As such, what is needed is a SRAM device with a leakage current reduction feature, without causing reliability issues.

SUMMARY

The present invention discloses a memory device with a leakage current reduction feature. In one embodiment of the present invention, the memory device includes at least one memory cell for storing a value, and at least one switch module coupled to the memory cell for generating an operating voltage at various levels depending on various operation modes of the memory cell. The operating voltage is at a first level when the memory cell is being accessed, and is at a second level lower than the first level when the memory cell is not being accessed, thereby reducing a leakage current for the memory cell.

The construction and method of operation of the invention, however, together with additional objectives and advantages thereof will be best understood from the following description of specific embodiments when read in connection with the accompanying drawings.

DESCRIPTION

Figure 1:
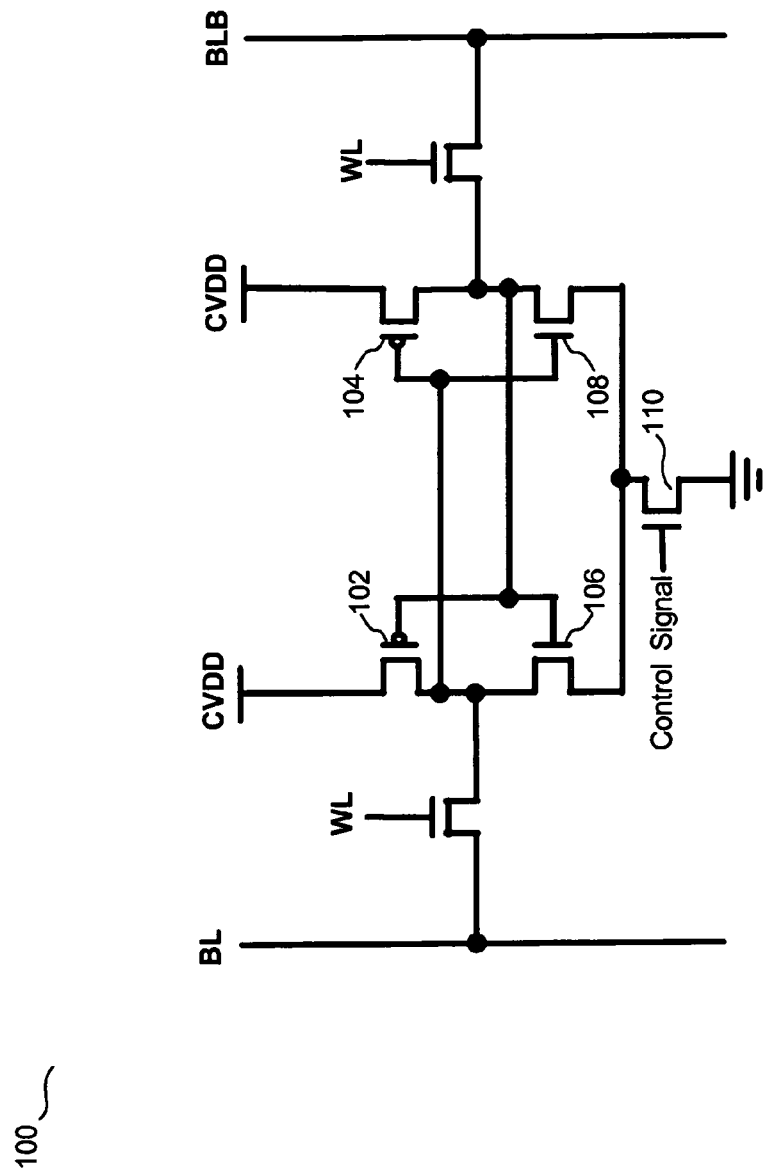
FIG. 1 schematically illustrates a conventional SRAM cell with a leakage current reduction feature.
Figure 2:
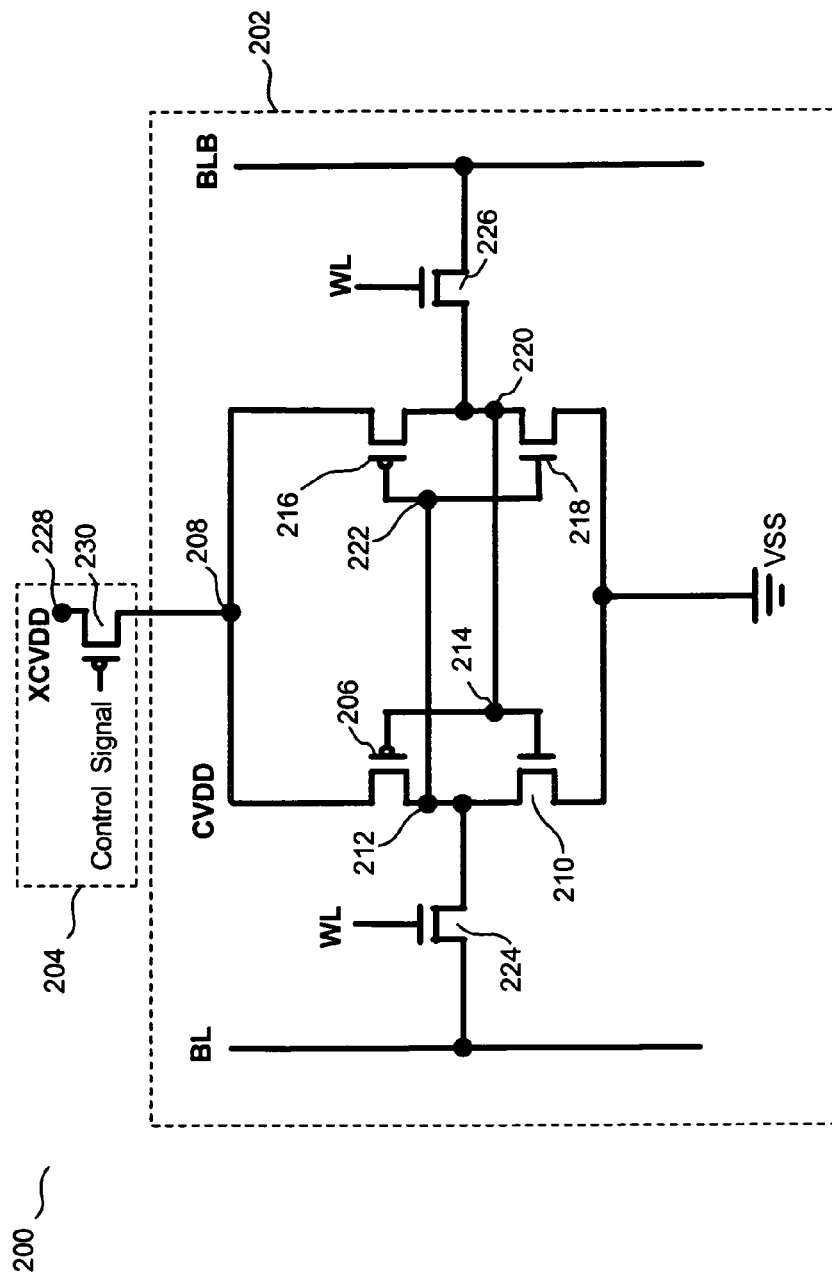
FIG. 2 schematically illustrates a circuit system for reducing the leakage current for an SRAM cell in accordance with one embodiment of the present invention.

FIG. 2 schematically illustrates a circuit system 200 for reducing the leakage current for an SRAM cell, such as a 5 T, 6 T, 8 T, 10 T, 12 T, 14 T or content-address memory (CAM) cell, in accordance with one embodiment of the present invention. The SRAM cell 202 includes a PMOS transistor 206 having a source coupled to an internal power supply node 208, which receives an operating voltage labeled by CVDD. An NMOS transistor 210 is serially coupled between the PMOS transistor 206 and ground or VSS. The drains of the PMOS and NMOS transistors 206 and 210 are coupled at a node 212, while the gates of the same are connected at a node 214. A PMOS transistor 216 and an NMOS transistor 218 are serially coupled between the internal power supply node 208 and ground or VSS. The drains of the PMOS transistor 216 and the NMOS transistor 218 are coupled at a node 220, which is further connected to the node 214, while the gates of the same are coupled at a node 222, which is further connected to the node 212. An NMOS transistor 224, which functions as a pass-gate device, is coupled between the node 212 and a bit line BL. An NMOS transistor 226, which also functions as a pass-gate device, is coupled between the node 220 and a complementary bit line BLB. The gates of the NMOS transistors 224 and 226 are coupled to a word line WL. When the SRAM cell 202 is being accessed, the NMOS transistors 224 and 226 are selected by the signal on the word line WL for allowing a data value to be written into or read from the nodes 212 and 220.

The switch module 204 is coupled between the internal power supply node 208 and an external power supply node 228 where the "internal" and "external" are named with reference to the cell 202. The switch module 204 receives an external operating voltage XCVDD from the node 228 and generates an internal operating voltage CVDD to the node 208. While the external operating voltage XCVDD can remain at a constant level, the internal operating voltage varies at a number of levels, depending on the operation mode of the cell 202. For example, when the cell 202 is in an active mode as it is being accessed for a read or write operation, the switch module 204 may generate the internal operating voltage CVDD at a normal level. When the cell 202 is in a standby mode as it is not being accessed, the switch module 204 may generate the internal operating voltage CVDD at a reduced level that is lower than the normal level. This reduces the leakage current for the cell 202 when it is not being accessed.

In this embodiment, the switch module 204 is a single PMOS transistor 230 having a source coupled to the node 228, a drain coupled to the node 208, and a gate controlled by a control signal with various voltage levels depending on the operation mode of the cell 202. For example, the control signal can have high, medium and low levels. When the cell 202 is being accessed, the low level control signal can be applied to fully turn on the PMOS transistor 230 for maintaining the internal operating voltage 208 at a normal level. When the cell 202 is not being accessed, the medium level control signal can be applied to slightly turn on the PMOS transistor 230 for reducing the internal operating voltage 208 to a lower than normal level, thereby reducing the leakage current from the node 228 to ground or VSS. Alternatively, the high level control signal can be applied when the cell 202 is not being accessed. This can slightly turn off the PMOS transistor 230, and therefore further reducing the leakage current.

Besides reducing the leakage current, the PMOS transistor 230 has another advantage as it does not affect the operation of the cell 202. The PMOS transistor 230 is constructed on a well that separates its source and drain from the substrate. Thus, the operation of the PMOS transistor 230 would not affect the NMOS transistors 210, 218, 224 and 226, as it is not directly constructed on the substrate as they are.

Figure 3:
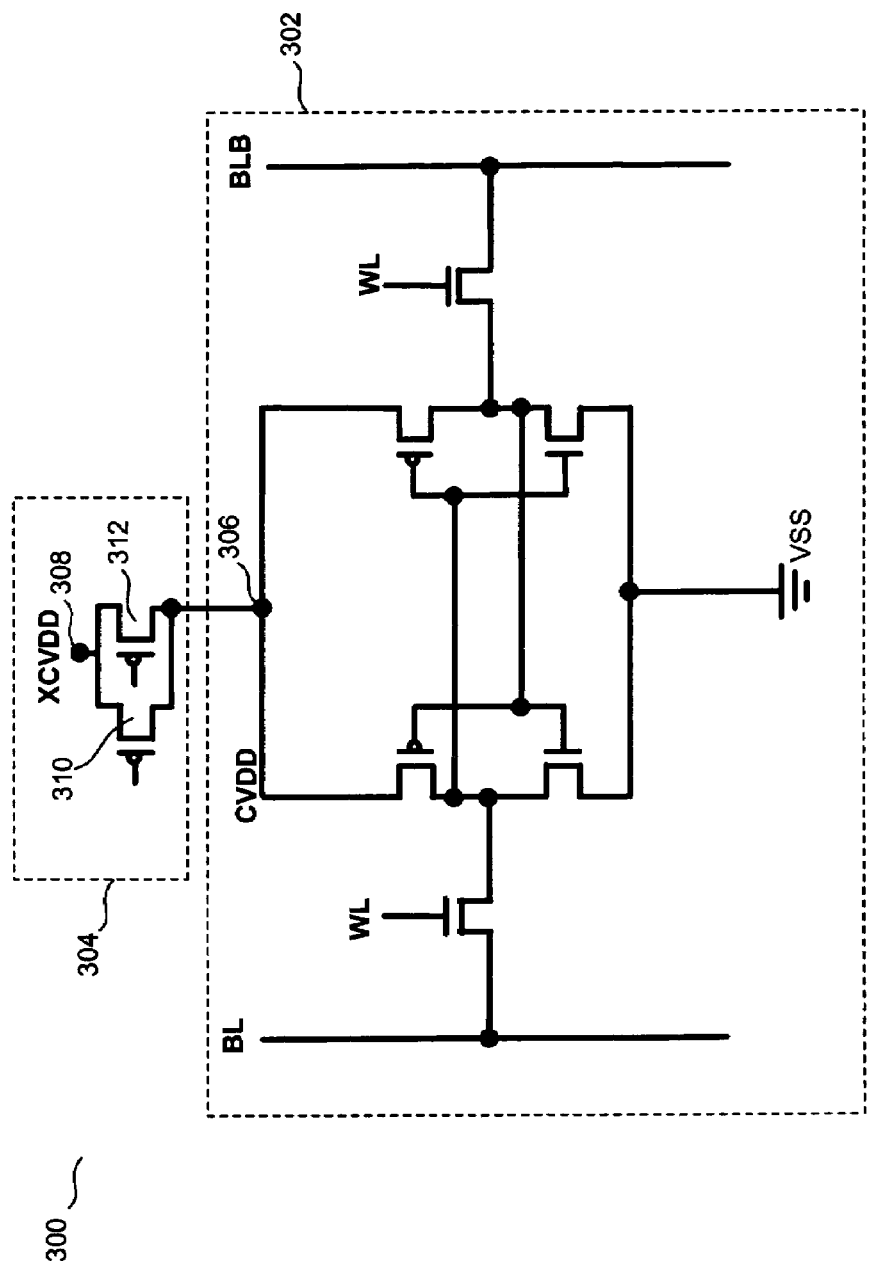
FIG. 3 schematically illustrates a circuit system for reducing the leakage current for an SRAM cell in accordance with another embodiment of the present invention.

FIG. 3 schematically illustrates a circuit system 300 for reducing the leakage current for a SRAM cell in accordance with another embodiment of the present invention. The circuit system 300 includes an SRAM cell 302 and a switch module 304. The cell 302 is similar to the cell 202 in FIG. 2, and therefore its construction is not detailed here. The switch module 304 is coupled between an internal power supply node 306 and an external power supply node 308. The switch module 304 receives an external operating voltage XCVDD from the node 308 and generates an internal operating voltage CVDD to the node 306. While the external operating voltage XCVDD can remain at a constant level, the internal operating voltage varies at a number of levels, depending on the operation mode of the cell 302.

In this embodiment, the switch module 304 includes two PMOS transistors 310 and 312 wherein the PMOS transistor 310 is larger than the PMOS 312 in size. When the cell 302 is being accessed, both the PMOS transistors 310 and 312 are turned on for maintaining the internal operating voltage CVDD at a normal level. When the cell 302 is not being accessed, the PMOS transistor 310 is turned on, while the PMOS transistor 312 is turned off, such that the internal operating voltage CVDD can be maintained at a reduced level lower than the normal level, thereby reducing the leakage current from the node 308 to the ground or VSS. Alternatively, the PMOS transistor 310 can be turned off and the PMOS transistor 312 can be turned on for further reducing the leakage current, when the cell 302 is not being accessed. The selection between the transistors 310 and 312 can be determined depending on design requirements. Note that while this embodiment shows only two PMOS transistors in the switch module, more can be used to provide the internal operating voltage CVDD with more levels for optimizing the power consumption of the cell 302.

Besides reducing the leakage current, the PMOS transistors 310 and 312 have another advantage as they do not affect the operation of the cell 302. The PMOS transistors 310 and 312 are constructed on wells that separate their sources and drains from the substrate. Thus, the operation of the PMOS transistors 310 and 312 would not affect the NMOS transistors within the cell 302.

Note that while the switch modules in the above embodiments are shown to be connected with the SRAM cells directly, a global switch module can be implemented for a memory array that contains a plurality of cells. This reduces the area occupied by the switch module and simplifies the circuit design for SRAM.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A memory device comprising:
   at least one memory cell for storing a value; and
   at least one switch module coupled between the memory cell and a power supply external to the cell for generating an operating voltage at various levels depending on various operation modes of the memory cell,
   wherein the switch module comprises a first PMOS transistor and a second PMOS transistor with a physical dimension different from that of the first PMOS transistor, and
   wherein the operating voltage is at a first level when the first and second PMOS transistors are turned on when the memory cell is being accessed, and is at a second level lower than the first level when the first PMOS transistor is turned on and the second PMOS transistor is turned off when the memory cell is not being accessed, thereby reducing a leakage current of the memory cell.

2. The memory device of claim 1, wherein the memory cell is a static random access memory (SRAM) cell of a type including, but not limited to, 5 T, 6 T, 8 T, 10 T, 12 T, 14 T or content-address memory (CAM).

3. The memory device of claim 2, wherein the memory cell comprises:
   a first PMOS transistor having a source coupled to the switch module;
   a first NMOS transistor having a gate coupled to a gate of the first PMOS transistor, a drain coupled to a drain of the first PMOS transistor, and a source coupled to ground;
   a second PMOS transistor having a gate coupled to the drain of the first PMOS transistor, and a source coupled to the switch module; and
   a second NMOS transistor having a gate coupled to the gate of the second PMOS transistor, a drain coupled to a drain of the second PMOS transistor, and a source coupled to ground,
   wherein the gates of the first PMOS and NMOS transistors are coupled to the drains of the second PMOS and NMOS transistors, and the gates of the second PMOS and NMOS transistors are coupled to the drains of the first PMOS and NMOS transistors.

4. The memory device of claim 3, wherein the memory cell further comprises:
   a third NMOS transistor being coupled between the drain of the first PMOS transistor and a bit line, and having a gate coupled to a word line, and
   a fourth NMOS transistor being coupled between the drain of the second PMOS transistor and a complementary bit line, and having a gate coupled to the word line.

5. The memory device of claim 1, wherein the switch module comprises a PMOS transistor having a drain coupled to the memory cell, a source coupled to a power supply external to the memory cell, and a gate controlled by a control signal.

6. The memory device of claim 5, wherein the control signal is at a first voltage level when the memory cell is being accessed, and is at a second voltage level higher than the first voltage level when the memory cell is not being accessed.

7. The memory device of claim 5, wherein the control signal is at a voltage level that turns off the PMOS transistor when the memory cell is not being accessed.

8. The memory device of claim 1, wherein the operating voltage is at a third level lower than the second level when the first PMOS transistor is turned off and the second PMOS transistor is turned on when the memory cell is not being accessed.

9. A system for reducing a leakage current of a static random access memory (SRAM), comprising:
at least one memory cell comprising:
a first PMOS transistor;
a first NMOS transistor having a gate coupled to a gate of the first PMOS transistor, a drain coupled to a drain of the first PMOS transistor, and a source coupled to ground;
a second PMOS transistor having a gate coupled to the drain of the first PMOS transistor;
a second NMOS transistor having a gate coupled to the gate of the second PMOS transistor, a drain coupled to a drain of the second PMOS transistor, and a source coupled to ground,
wherein the gates of the first PMOS and NMOS transistors are coupled to the drains of the second PMOS and NMOS transistors, and the gates of the second PMOS and NMOS transistors are coupled to the drains of the first PMOS and NMOS transistors; and
a third PMOS transistor and a fourth PMOS transistor with a physical dimension different from that of the third PMOS transistor and coupled in parallel to the third PMOS transistor having a source coupled to a power supply and a drain coupled to sources of the first and second PMOS transistors for generating an operating voltage at various levels depending on various operation modes of the memory cell,
wherein the operating voltage is at a first level when the third and fourth PMOS transistors are turned on when the memory cell is being accessed, and is at a second level lower than the first level when the third PMOS transistor is turned on and the fourth PMOS transistor is turned off when the memory cell is not being accessed, thereby reducing a leakage current for the memory cell.

10. The system of claim 9, wherein the memory cell further comprises:
a third NMOS transistor being coupled between the drain of the first PMOS transistor and a bit line, and having a gate coupled to a word line, and
a fourth NMOS transistor being coupled between the drain of the second PMOS transistor and a complementary bit line, and having a gated coupled to the word line.

11. The system of claim 9, wherein the third PMOS transistor having a gate controlled by a control signal.

12. The system of claim 11, wherein the control signal is at a first voltage level when the memory cell is being accessed, and is at a second voltage level higher than the first voltage level when the memory cell is not being accessed.

13. The system of claim 11, wherein the control signal is at a voltage level that turns off the third PMOS transistor when the memory cell is not being accessed.

14. The system of claim 9, wherein the SRAM comprises a 5 T, 6 T, 8 T, 10 T, 12 T, 14 T or content-address memory (CAM) cell.

15. A system for reducing leakage current of a static random access memory (SRAM), comprising:
at least one memory cell comprising:
a first PMOS transistor;
a first NMOS transistor having a gate coupled to a gate of the first PMOS transistor, a drain coupled to a drain of the first PMOS transistor, and a source coupled to ground;
a second PMOS transistor having a gate coupled to the drain of the first PMOS transistor;
a second NMOS transistor having a gate coupled to the gate of the second PMOS transistor, a drain coupled to a drain of the second PMOS transistor, and a source coupled to ground,
wherein the gates of the first PMOS and NMOS transistors are coupled to the drains of the second PMOS and NMOS transistors, and the gates of the second PMOS and NMOS transistors are coupled to the drains of the first PMOS and NMOS transistors;
a third PMOS transistor having a drain coupled to sources of the first and second PMOS transistors; and
a fourth PMOS transistor having a drain coupled to the sources of the first and second PMOS transistors and being smaller than the third PMOS transistor in size and coupled in parallel to the third PMOS transistor,
wherein the third and fourth PMOS transistors are selectively turned on for generating an operating voltage at least at three different levels depending on various operation modes of the memory cell.

16. The system of claim 15, wherein the third and fourth PMOS transistors are turned on when the memory cell is being accessed.

17. The system of claim 15, wherein the third PMOS transistor is turned on and the fourth PMOS transistor is turned off when the memory cell is not being accessed.

18. The system of claim 15, wherein the third PMOS transistor is turned off and the fourth PMOS transistor is turned on when the memory cell is not being accessed.

19. The system of claim 15, wherein the SRAM comprises a 5 T, 6 T, 8 T, 10 T, 12 T, 14 T or a content-address memory (CAM) cell.

* * * * *